(12) United States Patent
Yu et al.

(10) Patent No.: US 11,705,408 B2
(45) Date of Patent: Jul. 18, 2023

(54) SEMICONDUCTOR PACKAGE

(71) Applicant: Taiwan Semiconductor Manufacturing Company, Ltd., Hsinchu (TW)

(72) Inventors: Chi-Yang Yu, Taoyuan (TW); Jung-Wei Cheng, Hsinchu (TW); Yu-Min Liang, Taoyuan (TW); Jiun-Yi Wu, Taoyuan (TW); Yen-Fu Su, Hsinchu (TW); Chien-Chang Lin, New Taipei (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/185,944

(22) Filed: Feb. 25, 2021

(65) Prior Publication Data

US 2022/0270987 A1 Aug. 25, 2022

(51) Int. Cl.
*H01L 23/58* (2006.01)
*H01L 23/16* (2006.01)
*H01L 23/31* (2006.01)
*H01L 23/00* (2006.01)

(52) U.S. Cl.
CPC ............ *H01L 23/585* (2013.01); *H01L 23/16* (2013.01); *H01L 23/3121* (2013.01); *H01L 24/13* (2013.01); *H01L 24/32* (2013.01); *H01L 24/73* (2013.01); *H01L 2224/73204* (2013.01)

(58) Field of Classification Search
CPC ... H01L 23/585; H01L 23/16; H01L 23/3121; H01L 24/13; H01L 24/32; H01L 24/73; H01L 2224/73204
See application file for complete search history.

(56) References Cited

U.S. PATENT DOCUMENTS

| | | | |
|---|---|---|---|
| 8,907,472 B2* | 12/2014 | Hung | H01L 23/473 257/713 |
| 10,643,924 B1* | 5/2020 | Shen | H01L 23/3675 |
| 2007/0158826 A1* | 7/2007 | Sakakibara | B81B 7/0064 257/723 |
| 2008/0224304 A1* | 9/2008 | Watanabe | H01L 23/04 257/730 |
| 2009/0029554 A1* | 1/2009 | Chang-Chien | H01L 21/6835 257/E21.249 |
| 2018/0342466 A1* | 11/2018 | Lin | H01L 21/56 |
| 2019/0096837 A1* | 3/2019 | Lin | H01L 29/06 |
| 2022/0230969 A1* | 7/2022 | Yeh | H01L 25/18 |

* cited by examiner

Primary Examiner — Douglas W Owens
(74) Attorney, Agent, or Firm — JCIPRNET

(57) ABSTRACT

A semiconductor package includes a substrate, a semiconductor device, and a ring structure. The semiconductor device disposed on the substrate. The ring structure disposed on the substrate and surrounds the semiconductor device. The ring structure includes a first portion and a second portion. The first portion bonded to the substrate. The second portion connects to the first portion. A cavity is between the second portion and the substrate.

20 Claims, 14 Drawing Sheets

SEMICONDUCTOR PACKAGE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated packages are becoming increasingly popular for their compactness. An example of such packaging systems is System on Integrated System (SoIS) technology. In an SoIS device, a top integrated fan-out device, such as a system-on-chip (SoC) package, is stacked on top of a bottom integrated fan-out device, such as a large substrate (e.g., a printed circuit board). These and other advanced packaging technologies enable production of semiconductor devices with enhanced functionalities and small footprints.

BRIEF DESCRIPTION OF THE DRAWINGS

Aspects of the present application are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
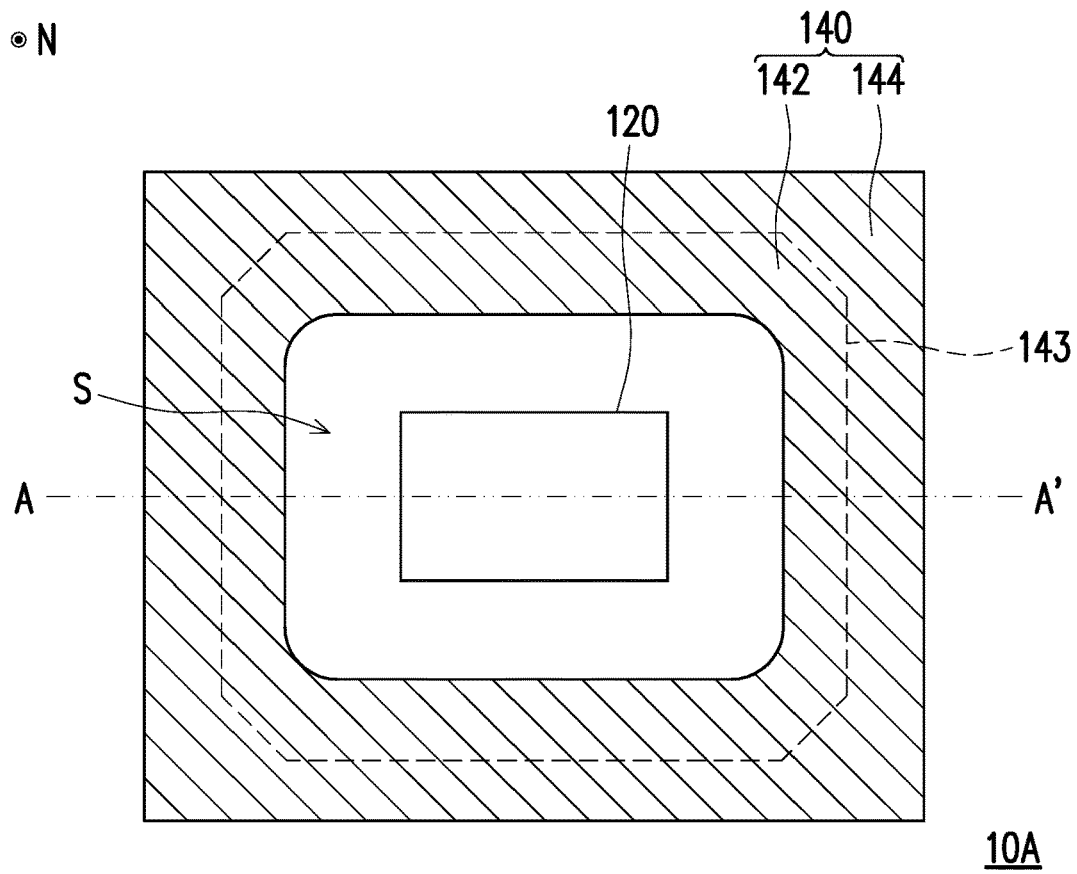
FIG. 1A illustrates a top view of the semiconductor package in accordance with some embodiments of the present application.

The following disclosure provides many different embodiments, or examples, for implementing different features of the invention. Specific examples of components and arrangements are described below to simplify the present application. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present application may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
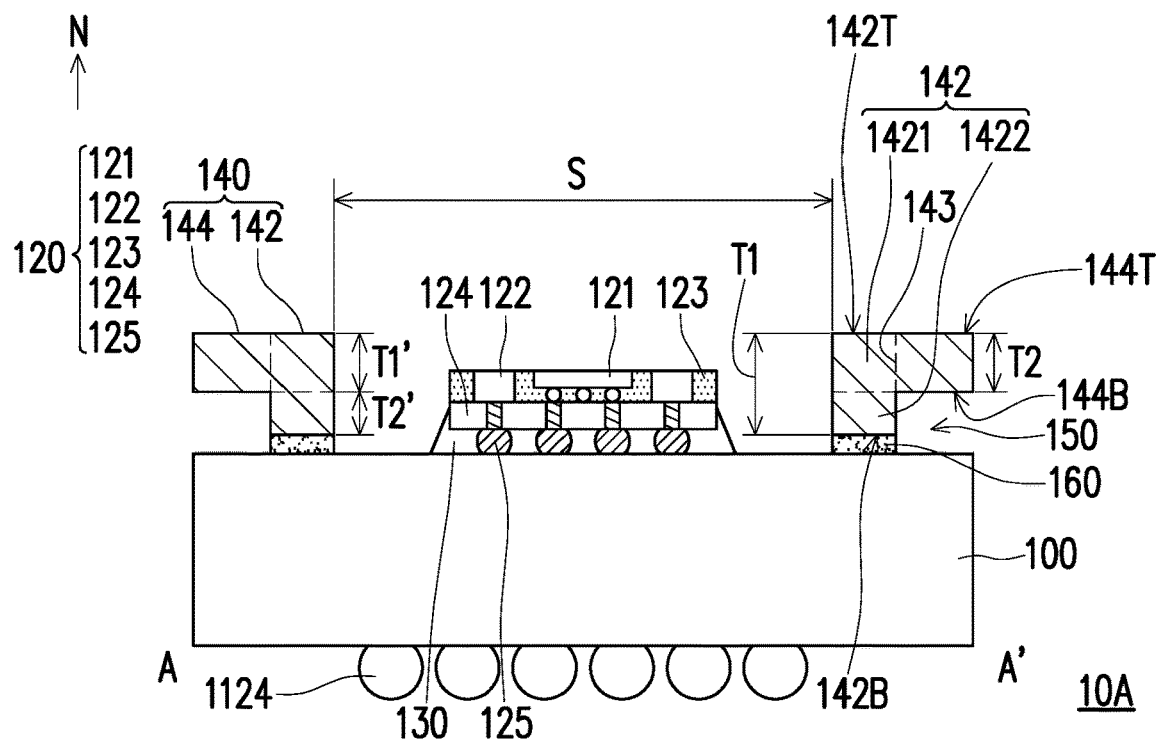
FIG. 1B is a schematic cross-sectional view illustrating the semiconductor package along the cross-sectional line A-A' in FIG. 1A.

FIG. 1A illustrates a top view of the semiconductor package in accordance with some embodiments of the present application. FIG. 1B is a schematic cross-sectional view illustrating the semiconductor package along the cross-sectional line A-A' in FIG. 1A.

Referring to FIG. 1A and FIG. 1B, a semiconductor package 10A including a substrate 100, a semiconductor device 120, and a ring structure 140 is provided. The substrate 100 is a wiring substrate, such as a printed circuit board (PCB). In some embodiments, the substrate is a doped silicon substrate an undoped silicon substrate, or an active layer of a silicon-on-insulator (SOI) substrate. In some embodiments, the substrate 100 is a system on integrated substrate (SoIS). In some other embodiments, the substrate 100 is a glass substrate, a ceramic substrate, a polymer substrate, or any other substrate that may provide a suitable protection and/or interconnection functionality.

In some embodiments, the substrate 100 includes electrical components, such as resistors, capacitors, signal processing circuitry, or combinations thereof. The electrical components may be active components or passive components, but not limited thereto.

Referring to FIG. 1A and FIG. 1B, the semiconductor device 120 is disposed on the substrate 100. The semiconductor device 120 may be an integrated fanout package structure, a package structure including interposer or other applicable types of package structures. The semiconductor device 120 includes an semiconductor die 121, a plurality of memory devices 122, an encapsulant 123, an interposer 124, and a plurality of conductive terminals 125. The semiconductor die 121 and the memory devices 122 are disposed over the interposer 124. The encapsulant 123 is disposed over the interposer 124 and encapsulates the semiconductor die 121 and the memory devices 122. In some embodiments, the top surface of the encapsulant 123 may be substantially coplanar with the top surface of the semiconductor die 121 or the top surface of the memory devices 122.

The semiconductor die 121 includes a system-on-chip (SoC) device, or any other suitable types of devices. The SoC device, for example, includes a semiconductor substrate and a plurality of micro bumps. The micro bumps may be electrically coupled to the through vias of the interposer 124. The semiconductor substrate includes a silicon substrate having active components (e.g., transistors or the like) or passive components (e.g., resistors, capacitors, inductors, or the like) formed therein. The micro bumps include aluminum pads, copper pads, or other suitable metal pads.

The memory devices 122 includes High-Bandwidth Memory (HBM) devices, or any other suitable types of devices. The HBM device, for example, include a plurality of dies, a controller, and a plurality of conductive pads. In some embodiments, the dies are stacked together to form a die stack. The controller may be disposed over the die stack. The conductive pads may be disposed over the controller. The conductive pads may be electrically coupled to the through via of the interposer 124. The conductive pads may be aluminum pads, copper pads, or other suitable metal pads.

The conductive terminals 125 are disposed on the interposer 124 and connected to the through vias of the interposer 124. The conductive terminals 125 are used to connect the semiconductor device 120 to the top surface of the substrate 100. The conductive terminals 125 include controlled collapse chip connection (C4) bumps, or other suitable terminals for providing external connections to the semiconductor die 121 and the memory devices 122. Other possible forms and shapes of the conductive terminals 125 may be utilized according to design requirements.

The conductive terminals 125 is disposed between the interposer 124 and the substrate 100. An underfill 130 is dispensed in a gap between the interposer 124 and the top surface of the substrate 100. In some embodiments, the underfill 130 is disposed by using a dispensing needle or other suitable dispensing tool into the gap between the interposer 124 and the substrate 100. The underfill 130 also fills the spaces between the conductive terminals 125. The underfill 130 may be a liquidous epoxy-based material. After the underfill 130 is disposed, the underfill 130 may be photocured or thermally cured, or a combination thereof. As illustrated in FIG. 1B, a portion the underfill 130 also contacts the side surface of the interposer 124, but not limited thereto. Under the above configurations, the underfill 130 may absorb stress and protect the conductive terminals 125.

Referring to FIG. 1A and FIG. 1B, the ring structure 140 is disposed on the substrate 100. The ring structure 140 surrounds the semiconductor device 120. The ring structure 140 includes a first portion 142 and a second portion 144 connected to the first portion 142. In the illustrated embodiment, the ring structure may be made of rigid materials, for example, metal, metal alloys, glass, ceramics, or the like, but not limited thereto. A rigidity (also refer as stiffness) of a material may be defined as a measurement of the resistance offered by the material to deformation. For example, for a single degree of freedom, the rigidity of the material may be defined as $k=F/\delta$, wherein k is the rigidity of the material, F is the force acted on the material, and $\delta$ is the displacement produced by the force along the same degree of freedom. Rigidity is measured in newtons per meter (N/m) or in pounds per inch. In some embodiment, the metal material includes stainless steel, copper, or copper alloy, but not limited thereto. In some embodiments, the first portion 142 and the second portion 144 are made of the same material.

In some embodiments, the first portion 142 of the ring structure 140 bonds to the substrate 100. In some other embodiments, the ring structure 140 is a multi-ring structure. The first portion 142 is considered as a first ring, and the second portion 144 connected to the first ring 142 is considered as a second ring. The first portion 142 includes a top portion 1421 and a bottom portion 1422. The second portion 144 is connected to the top portion 1421 and surrounds the first portion 142. An interface 143 (shown as a dashed line in FIG. 1A and FIG. 1B) is between the top portion 1421 and the second portion 144. On a normal axis N of the substrate 100, the interface 143 approximately shows that the first portion 142 is an octagonal ring, but not limited thereto.

The bottom portion 1422 is connected to the top surface of the substrate 100 by a bonding layer 160. The top portion 1421 is disposed over the bottom portion 1422. In the illustrated embodiment, the second portion 144 does not contact the substrate 100 and the bottom portion 1422. A cavity 150 is between the second portion 144 and the substrate 100. In some embodiments, the cavity 150 is a space defined by the second portion 144, the bottom portion 1422 and the top surface of the substrate 100.

Specifically, the first portion 142 may have a top surface 142T and a bottom surface 142B. The top surface 142T may be the top surface of the first portion 1421, and the bottom surface 142B may be the bottom surface of the second portion 1422. The second portion 144 may have a top surface 144T and a bottom surface 144B. The first portion 142 and the second portion 144 may be integrally formed by the same material. The top surface 142T of the first portion 142 is substantially coplanar with the top surface 144T of the second portion 144. That is to say, the top portion 1421 is substantially coplanar with the second portion 144. The bottom surface 142B of the first portion 142 is bonded to the substrate 100 through the bonding layer 160. The bottom surface 142B of the first portion 142 is at a lower horizontal plane than the bottom surface 144B of the second portion 144, thus resulting in a height difference.

In some embodiments, the thickness of the first portion 142 and the thickness of the second portion 144 are different. In the illustrated embodiment, the first thickness T1 of the first portion 142 is defined as the distance between the top surface 142T and the bottom surface 142B along the normal axis N of the substrate 100. The second thickness T2 of the second portion 144 is defined as the distance between the top surface 144T and the bottom surface 144B along the normal axis N of the substrate 100. The first thickness T1 is greater than the second thickness T2.

The first thickness T1 of the first portion 142 may also be defined as the combined thickness of the thickness T1' of the top portion 1421 and the thickness T2' of the bottom portion 1422. In some embodiments, the thickness T1' of the top portion 1421 is substantially the same as the second thickness T2 of the second portion 144, but not limited thereto. In some other embodiments, the second thickness T2 is larger than or smaller than the thickness T1' of the top portion 1421. The second thickness T2 is not larger than the combined thickness of the top portion 1421 and the bottom portion 1422.

Referring to FIG. 1B, the bonding layer 160 is disposed between the substrate and the first portion 142. Specifically, the bonding layer 160 is used to bond the bottom portion 1422 to the substrate 100. The bonding layer 160 bonds the bottom surface 142B to the substrate 100. In some embodiments, the bonding layer 160 may be deposited or laminated to the substrate 100. The bonding layer 160 may be a molding compound, a resin (such as epoxy, or silicone), or the like.

In some embodiments, the cavity 150 is defined as a space between the second portion 144 and the substrate 100. In some other embodiments, the cavity 150 is further defined as the space between the bottom surface 144B, the bottom portion 1422, and the substrate 100. The cavity 150 encircles the bottom portion 1422 of the first portion 142 underneath the second portion 144. In other words, the cavity 150 overlaps with the second portion 144 and surrounds the first portion 142 along the outline of the interface 143 (shown as the dashed line in FIG. 1A and FIG. 1B).

In some embodiments, the cavity 150 is also defined by the bonding layer 160. The bonding layer 160 overlaps with the bottom portion 1422 the first portion 142. A sidewall of the bonding layer 160 is aligned with a side wall of the bottom portion 1422. That is to say, the sidewall of the bonding layer does not extend along the sidewall of the bottom portion 1422 of the first portion 142. According to the above configurations, the height of the cavity 150 (such as a distance from the bottom surface 144B to the top surface of the substrate 100) is defined as the total thickness of the thickness T2' of the bottom portion and the thickness of the bonding layer 160.

Referring to FIG. 1A and FIG. 1B, an inner edge of the first portion 142 encircles a space S. In the illustrated embodiment, the inner edge of the top portion 1421 and the inner edge of the bottom portion 1422 are aligned, and is referred as the inner edge of the first portion 142. According to the top view of FIG. 1A (e.g. on the normal axis N), the inner edge of the first portion 142 is a rounded rectangle (e.g. a rectangle with rounded angle). Moreover, on the normal axis N, the first portion 142 may be an octagon with a rounded rectangle inner edge. The outer edge of the second portion 144 may be a rectangle. That is to say, the ring structure 140 may be a rectangle with the inner edge encircling the rounded rectangle space S, but the embodiment is not limiter thereto. The semiconductor device 120 is placed in the space S. In some embodiments, the second portion 144 surrounds the first portion 142 and the semiconductor device 120. The semiconductor device 120 is separated from the ring structure 140.

Is should be noted that, the material of the substrate 100 and the material of the semiconductor device 120 are different. The different materials have different coefficients of thermal expansion (CTE). During the manufacturing process, a coefficient of thermal expansion mismatch causes each of the materials to expand differently when the semiconductor package is heated for testing or for use. As such, at elevated temperatures there is the coefficient of thermal expansion mismatch that causes stresses to form between the different materials and, hence, the different parts of the semiconductor package. These stresses may cause delamination to occur between the various layers of material. For example, the high stress caused by the high temperature during the manufacturing process may cause thermal expansion mismatch or warpages in the substrate 100 and the semiconductor device 120. The above warpages may induce underfill 130 cracking at high temperature and damage the semiconductor device 120. The semiconductor package 10A provided in the illustrated embodiment includes the ring structure 140 composed of the rigid material such as stainless steel being disposed on the substrate 100 and encircled the semiconductor device 120. The first thickness T1 of the first portion 142 is greater than the second thickness T2 of the second portion 144. According to the above configurations, the ring structure 140 provides additional support to the semiconductor package 10A and at a location closer to the semiconductor device 120. Therefore, the reliability of the semiconductor package 10A is improved, and the warpage is reduced. Furthermore, the risk of damaging the semiconductor device 120 is reduced, and the quality of the semiconductor package 10A is improved.

Furthermore, the cavity 150 exists between the second portion 144 and the substrate 100. Therefore, the second portion 144 does not contact the substrate 100, allowing the second portion 144 be used to dissipate heat. Therefore, the quality of the semiconductor package 10A is further improved.

Figure 1C:
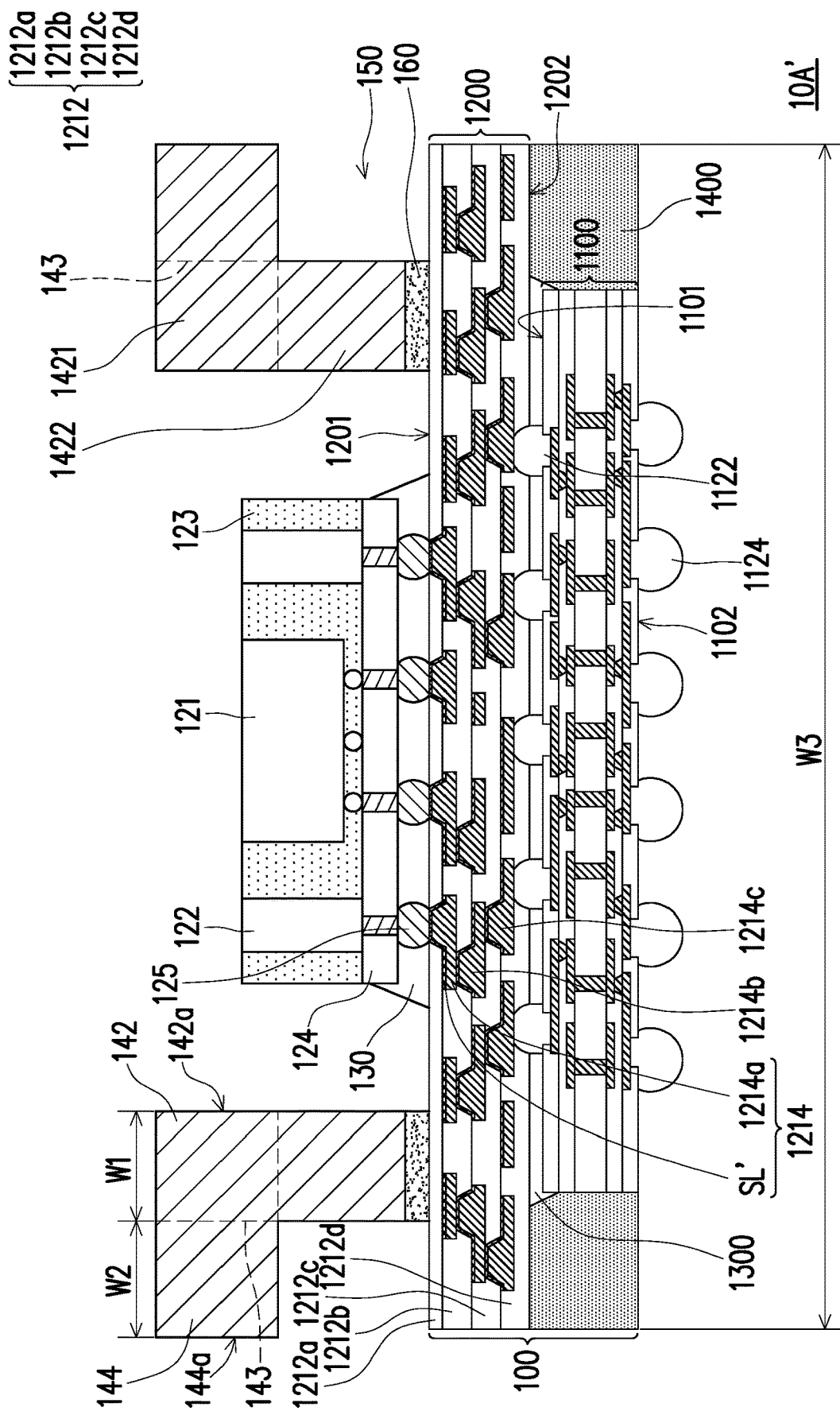
FIG. 1C is a schematic cross-sectional view illustrating the system on integrated substrate of the semiconductor package in accordance with some embodiments of the present application.

FIG. 1C is a schematic cross-sectional view illustrating the system on integrated substrate of the semiconductor package. In some embodiments, the substrate 100 of the semiconductor package 10A' is a system on integrated substrate. The substrate 100 is described hereinafter.

The substrate 100 includes a wiring substrate 1100, a redistribution circuit structure 1200, an underfill 1300, and an insulating encapsulation 1400, but not limited thereto. The redistribution circuit structure 1200 is disposed on the wiring substrate 1100. The insulating encapsulation is formed on the redistribution circuit structure 1200 to laterally encapsulate the wiring substrate 1100.

Specifically, the redistribution circuit structure 1200 may include stacked dielectric layers 1212 and the redistribution wirings 1214 between the stacked dielectric layers 1212. The stacked dielectric layers 1212 are stacked along the normal axis N. The redistribution wirings 1214 are embedded in the stacked dielectric layers 1212.

As illustrated in FIG. 1C, a first dielectric layer 1212a is provided. The first dielectric layer 1212a may include openings. In some embodiments, the material of the first dielectric layer 1212a includes polybenzoxazole (PBO), polyimide (PI) or other suitable polymer dielectric material. In some alternative embodiments, the material of the dielectric layer 1212a includes resin mixed with filler. The first dielectric layer 1212a may be formed by photo-patternable material and patterned by a photolithography process.

A seed layer (not shown) is formed to cover the first dielectric layer 1212a. The seed layer may be sputter Ti/Cu seed layer which entirely covers the first dielectric layer 1212a. After forming the seed layer, a patterned photoresist layer (not shown) is formed on the seed layer. The patterned photoresist layer includes trenches, and portions of the seed layer are revealed by the trenches defined in the patterned photoresist layer. After the patterned photoresist layer is formed on the seed layer, a plating process may be performed by using the patterned photoresist layer as a mask such that first conductive wirings 1214a are plated in the trench and cover the revealed portions of the seed layer.

After forming the first conductive wirings 1214a, the patterned photoresist layer is removed such that portions of the seed layer that are not covered by the first conductive wirings 1214a are revealed, and a patterned seed layer SL' is formed under the first conductive wirings 1214a. An etching process may be performed to remove the portions of the seed layer that are not covered by the first conductive wirings 1214a until portions of the first dielectric layer 1212a are revealed. As illustrated in FIG. 1C, the first conductive wirings 1214a and the patterned seed layer SL' may be considered as a layer of redistribution wirings.

After the first dielectric layer 1212a and the first conductive wirings 1214a are formed, a second dielectric layer 1212b, second conductive wirings 1214b, a third dielectric layer 1212c, third conductive wirings 1214c and a fourth dielectric layer 1212d may be formed over the first dielectric layer 1212a and the first conductive wirings 1214a, such that the redistribution circuit structure 1200 is formed. The fabrication process of the second dielectric layer 1212b, the third dielectric layer 1212c and the fourth dielectric layer 1212d may be similar to that of the first dielectric layer 1212a. The fabrication process of the second conductive wirings 1214b and the third conductive wirings 1214c may be similar to that of the first conductive wirings 1214a. The number of dielectric layers 1212 and redistribution wirings 1214 in the redistribution circuit structure 1200 may be modified in accordance with design rule of products The redistribution wirings 1214 may include conductive wirings and conductive vias electrically connected between conductive wirings, wherein the conductive wirings may transmit signal horizontally, and the conductive vias may transmit signal vertically. The material of the redistribution wirings 1214 may include copper or other suitable metallic materials.

The wiring substrate 1100 is provided over a surface 1202 of the redistribution circuit structure 1200. The wiring substrate 1100 may include conductive terminals 1122 formed thereon. In some embodiments, the wiring substrate 1100 includes a first surface 1101 (e.g., a top surface) and a second surface 1102 (e.g. a bottom surface) opposite to the first surface 1101. The conductive terminals 1122 are arranged in array and distributed on the first surface 1101 of the wiring substrate 1100. The conductive terminals 1122 may include solder posts or solder bumps arranged in array. The wiring substrate 1120 may be placed onto the surface of the redistribution circuit structure 1200 such that the first surface 1101 of the wiring substrate 1100 faces the redistribution circuit structure 1200. A reflow process is performed such that the wiring substrate 1100 can be electrically connected to the redistribution wirings 1214 of the redistribution circuit structure 1200 through the conductive terminals 1122. After the wiring substrate 1100 is mounted on the redistribution circuit structure 1200, a space is defined between the wiring substrate 1100 and the surface 1202 of the redistribution circuit structure 1200. In other words, the first surfaces 1101 of the wiring substrate 1100 is separated from the redistribution circuit structure 1200 by a predetermined distance. For example, the predetermined distance between the first surfaces 1101 of the wiring substrate 1100 and the surface 1202 of the redistribution circuit structure 1200 ranges from about 50 micrometers to about 100 micrometers, but not limited thereto.

The underfill 1300 is formed over the redistribution circuit structure 1200 to fill the space between the redistribution circuit structure 1200 and the wiring substrate 1100 and laterally encapsulate the conductive terminals 1122 such that reliability of the conductive terminals 1122 may be enhanced. The underfill 1300 may partially cover sidewalls of the wiring substrate 1100. In some alternative embodiments, formation of the underfill 1300 may be omitted. The material of the underfill 1300 may be an insulating material and include a resin (e.g., epoxy resin), a filler material, a stress release agent (SRA), an adhesion promoter, other material, or a combination thereof.

The insulating encapsulation 1400 is formed on the redistribution circuit structure 1200 to laterally encapsulate the wiring substrate 1100 and the underfill 1300. In some embodiments, an over-mold process is performed to form an encapsulation material over the redistribution circuit structure 1200 such that the wiring substrate 1100 and the underfill 1300 are covered by the encapsulation material. The material of the insulating encapsulation 1400 may include molding compound or molded underfill (MUF). In some embodiments, the material of the insulating encapsulation 1400 may include epoxy resins, phenolic hardeners, silicas, catalysts, pigments, mold release agents and so on. After forming the encapsulation material, a removal process is performed to partially remove a portion of the encapsulation material until the second surface 1102 of the wiring substrate 1100 is revealed. After performing the removal process of the encapsulation material, the insulating encapsulation 1400 is formed, wherein the second surface 1102 of the wiring substrate 1100 may be substantially leveled with, slightly lower than or slightly higher than a surface of the insulating encapsulation 1400. The above-mentioned removal process of the encapsulation material may be chemical mechanical polishing (CMP) process, mechanical grinding process or other suitable removal process.

After forming the insulating encapsulation 1400, a bottommost dielectric layer of the wiring substrate 1100 is patterned such that conductive wirings in the wiring substrate 1100 are revealed. Then, conductive terminals 1124 are formed on the second surface 1102 of the wiring substrate 1100, wherein the conductive terminals 1124 are electrically connected to the revealed conductive wirings in the wiring substrate 1100. The dimension of the conductive terminals 1124 may be greater than that of the conductive terminals 1122. In some embodiments, the conductive terminals 1124 includes ball-grid array (BGA) balls.

After forming the conductive terminals 1124, a resulted structure including the wiring substrate 1100, the redistribution circuit structure 1200, the conductive terminals 1122, the conductive terminals 1124, the underfill 1300 and the insulating encapsulation 1400 is formed as the system on integrated substrate. A surface 1201 is the topmost surface of the redistribution circuit structure 1200, and is opposite to the surface 1202 of the redistribution circuit structure 1200.

The uppermost redistribution wirings 1214 including the first conductive wirings 1214a and the patterned seed layer SL' are partially revealed from the surface 1201 of the redistribution circuit structure 1200. In other words, portions of the patterned seed layer SL' are revealed from the surface 1201 of the redistribution circuit structure 1200. Furthermore, the first dielectric layer 1212a is the topmost dielectric layer 1212. In the present embodiments, the thickness of the outermost dielectric layer 1212a of the redistribution circuit structure 1200 is greater than 7 micrometers such that the first dielectric layer 1212a can provide sufficient barrier and/or buffering function.

Referring to FIG. 1C, in the semiconductor package 10A', the semiconductor device 120 is provided and disposed on the surface 1201 of the redistribution circuit structure 1200, wherein the semiconductor device 120 is electrically connected to the wiring substrate 1100 through the redistribution circuit structure 1200.

The semiconductor device 120 is provided and mounted on the redistribution circuit structure 1200 through a chip-to-wafer bonding process, for example, such that the semiconductor device 120 is electrically connected to the outermost redistribution wirings 1214a of the redistribution circuit structure 1200. The semiconductor die 121 and the memory devices 122 of the semiconductor die 120 may be electrically connected to the redistribution wirings 1214a through conductive terminals 125. The underfill 130 is formed on the surface 1201 of the redistribution circuit structure 1200 so as to fill a space between the semiconductor device 120 and the redistribution circuit structure 1200. In addition, the underfill 130 may further cover sidewalls of the semiconductor device 120.

The ring structure 140 is provided and adhered with the surface 1201 of the redistribution circuit structure 1200 by the bonding layer 160. Please refer to FIG. 1B and FIG. 1C, the ring structure 140 includes the first portion 142 and the second portion 144. The first portion 142 further includes a top portion 1421 and a bottom portion 1422. In some embodiments, the ring structure 140 overlaps with the insulating encapsulation 1400 or the wiring substrate 1100.

In accordance to an embodiment, the top portion 1421 has a first width W1. The first width W1 of the top portion 1421 may be substantially the same as the width of the bottom portion 1422. The first width W1 is defined as a distance between the inner edge 142a of the first portion 142 and the interface 143 where the top portion 1421 connects to the second portion 144. The second portion 144 has a second width W2. The second width W2 is defined as a distance between the outer edge 144a of the second portion 144 and the interface 143. In some embodiments, a ratio of the first width W1 and the second width W2 is 2:8 to 9:1, but not limited thereto. In some other embodiments, a ratio of the first width W1 and a total width of the first width W1 and the second width W2 is 2:10 to 9:10, but not limited thereto. Furthermore, the substrate 100, or the redistribution circuit structure 1200, has a third width W3. A ratio of the total width of the first width W1 and the second width W2 and the third width W3 is 3:100 to 4:10, but not limited thereto. Under the above configurations, delamination issue may not occur at the interface between the first dielectric layer 1212a and the first conductive wirings 1214a, and reliability of the redistribution circuit structure 1200 and the semiconductor package 10A' may be improved.

Figure 2:
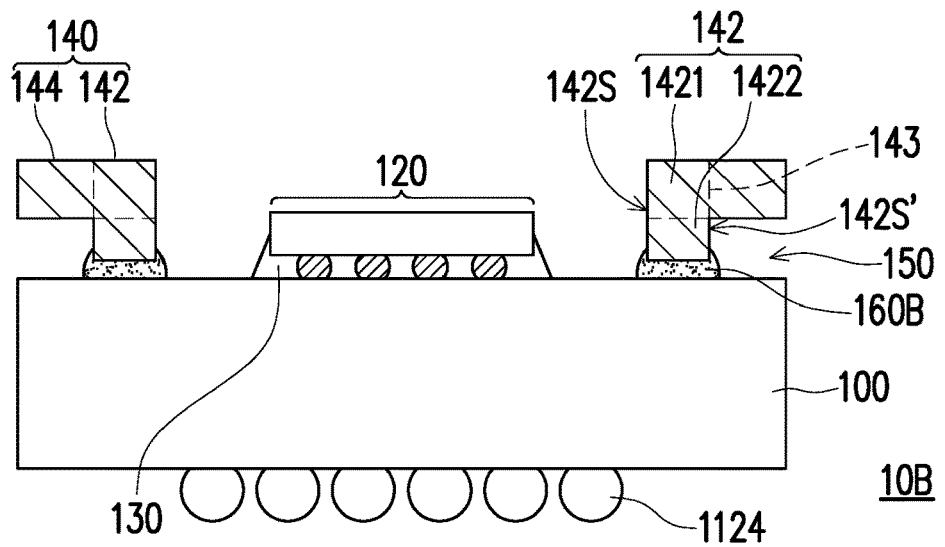
FIG. 2 to FIG. 4 illustrate various schematic cross-sectional views of semiconductor packages according to some embodiments of the present application.
Figure 3:
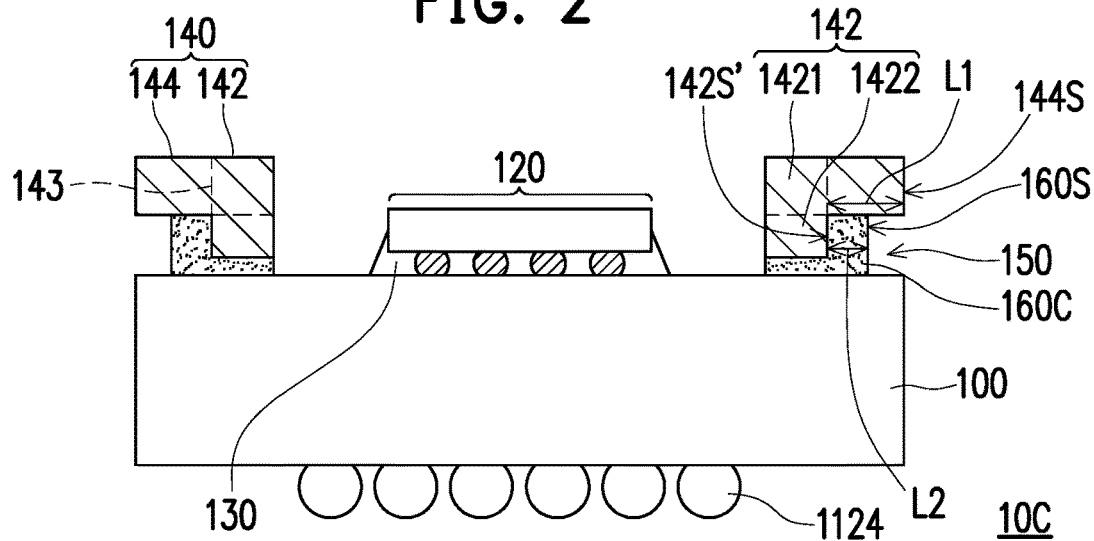
Figure 4:
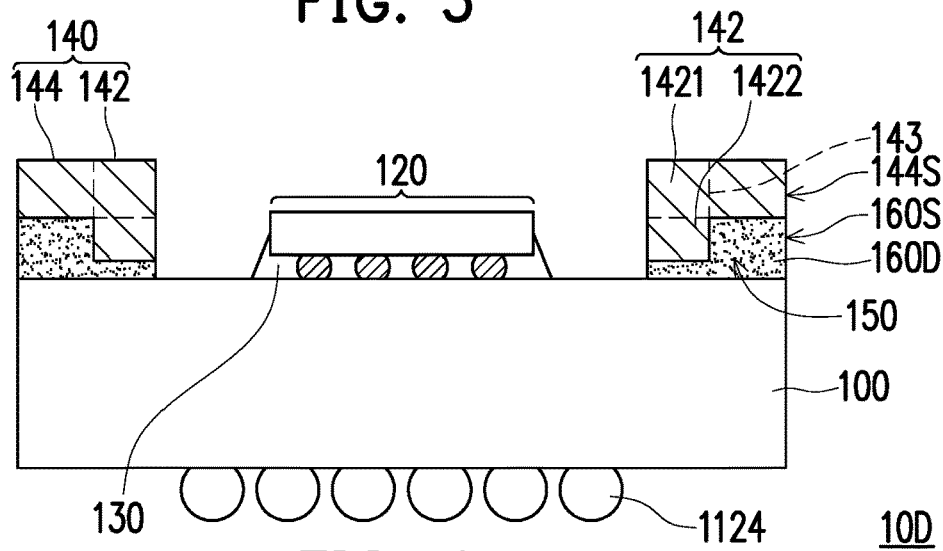

FIG. 2 to FIG. 4 illustrate various schematic cross-sectional views of semiconductor packages according to some embodiments of the present application. In some embodiments, the semiconductor package 10B of FIG. 2 is similar to the semiconductor package 10A illustrated in FIG. 1A and FIG. 1B, except that the bonding layer 160B is further extend along the sidewall 142S, and the sidewall 142S' of the bottom portion 1422 of the first portion 142. Specifically, the sidewall 142S is on a side of the bottom portion 1422 that faces the semiconductor device 142, and the sidewall 142S' is on another side of the bottom portion 1422 that faces the cavity 150. The bonding layer 160B partially fills the cavity 150, and extends along the sidewall 142S and the sidewall 142S'. The bonding layer 160B does not contact the second portion 144.

Referring to FIG. 3, the semiconductor package 10C of FIG. 3 is similar to the semiconductor package 10A illustrated in FIG. 1A and FIG. 1B, except that the bonding layer 160C partially fills the cavity 150. Specifically, the bonding layer 160C contacts the sidewall 142S' of the bottom portion 1422 and the bottom surface of the second portion 144. In some embodiments, a length L1 of the second portion 144 is defined as the shortest distance between the sidewall 142S' of the bottom portion 1422 and the sidewall 144S of the second portion 144. The sidewall 144S is the outer edge of the ring structure 140 (such as the outer edge of the second portion 144). In the illustrated embodiment, the bonding layer 160C is in contact with a portion of the second portion 144. Specifically, a horizontal length L1 of the second portion 144 is defined as the shortest distance between the sidewall 142S' and the sidewall 144S of the second portion 144. A horizontal length L2 of the bonding layer 160C in the cavity 150 is defined as the shortest distance between the sidewall 142S' and the sidewall 160S of the bonding layer 160C. The sidewall 160S is the outer edge of the bonding layer 160C. The amount of the bonding layer 160C contacting the second portion 144 is determined by the ratio of the length L2 to the length L1. For example, the ratio of the of the length L2 to the length L1 is 3:10 to 5:10. That is to say, the bonding layer 160C contacts approximately 30% to 50% of the length L1 of the second portion 144, but the embodiment is not limited thereto. In some other embodiments, when the total length L1 of the second portion 144 is directly proportional to volume of the cavity 150, the bonding layer 160C occupied approximately 30% to 50% of the total volume of the cavity 150. According to the above arrangement, the reliability of the semiconductor package 10C is improved, and the warpage is reduced.

Referring to FIG. 4, the semiconductor package 10D of FIG. 4 is similar to the semiconductor package 10A illustrated in FIG. 1A and FIG. 1B, except that the bonding layer 160D fills the cavity 150. Specifically, the sidewall 160S of the bonding layer 160D aligns with the sidewall 144S of the second portion 144 and the sidewall of the substrate 100. That is to say, the bonding layer 160D fills up the cavity 150, and contacts the second portion 144. In some other embodiments, the bonding layer 160D may also overfill the cavity 150, resulting in the sidewall 160S not aligned with the sidewall 144S. The bonding layer 160D may also further extend along the sidewall 144S. According to the above arrangement, the reliability of the semiconductor package 10D is improved, and the warpage is reduced.

Figure 5A:
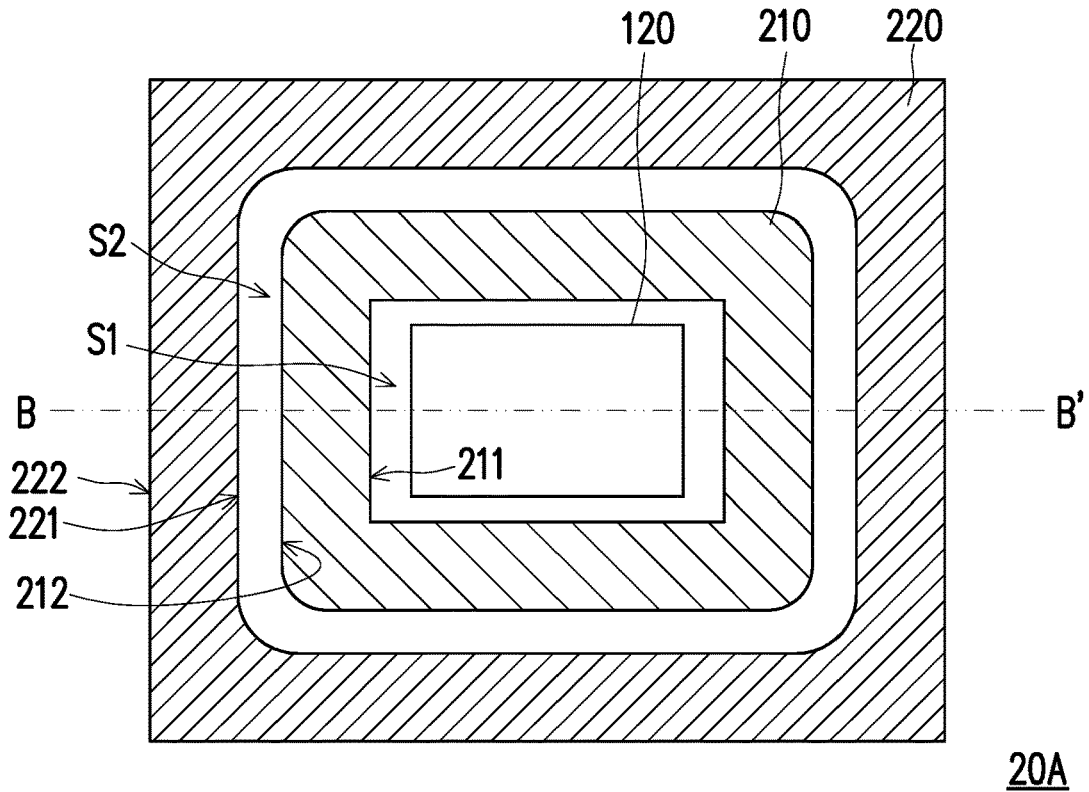
FIG. 5A illustrates a top view of the semiconductor package in accordance with some other embodiments of the present application.
Figure 5B:
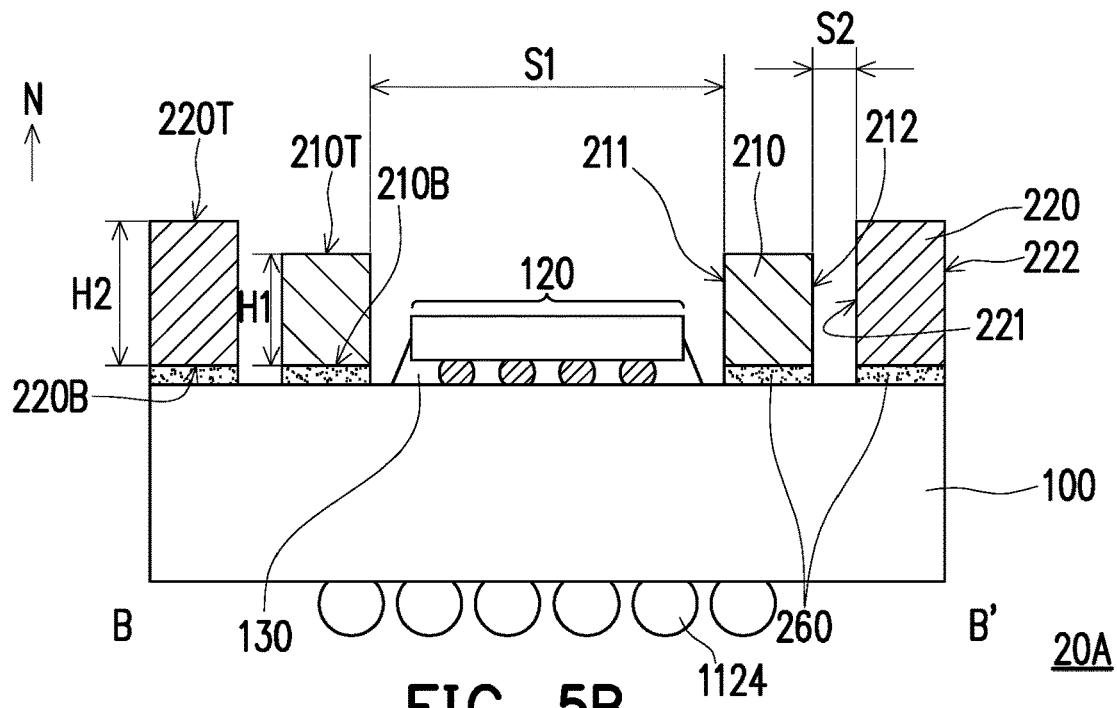
FIG. 5B is a schematic cross-sectional view illustrating the semiconductor package along the cross-sectional line B-B' in FIG. 5A.

FIG. 5A illustrates a top view of the semiconductor package in accordance with some other embodiments of the present application. FIG. 5B is a schematic cross-sectional view illustrating the semiconductor package along the cross-sectional line B-B' in FIG. 5A. The semiconductor package 20A of FIG. 5A is similar to the semiconductor package 10A illustrated in FIG. 1A and FIG. 1B, except that the ring structure including a multiple rings structure. Specifically, the semiconductor package 20A includes a first ring structure 210 and a second ring structure 220. The first ring structure 210 is disposed on the substrate 100 and surrounds the semiconductor device 120. The second ring structure 220 is disposed on the substrate 100 and surrounds the first ring structure 210.

In some embodiments, the first ring structure 210 includes two sidewalls opposite to each other, such as an inner edge 211 and an outer edge 212. The inner edge 211 faces the semiconductor device 120, and the outer edge 212 faces the second ring structure 220. The first ring structure 210 also include a top surface 210T and a bottom surface 210B. The bonding layer 260 is used to bond the bottom surface 210B of the first ring structure 210 to the substrate 100. In some embodiments, a material of the first ring structure 210 is stainless steel, glass, ceramics, copper alloy, or other suitable materials. In some other embodiments, the first ring structure overlaps a portion of the conductive terminals 1124, but not limited thereto.

In the illustrated embodiment, the top view (such as on the normal axis N of the substrate 100) of the outer edge 212 of the first ring structure 210 is a rounded rectangle, and the inner edge 211 is a rectangle. The inner edge 211 of the first ring structure 210 encircles a first space S1. The semiconductor device 120 is placed in the first space S1. In some embodiments, the top view (such as on the normal axis N of the substrate 100) of the first space S1 is selected from a square shape, a polygonal shape, a circular shape, and an ecliptically shape, but the embodiment is not limited thereto.

In some embodiments, the second ring structure 220 includes two sidewalls opposite to each other, such as an inner edge 221 and an outer edge 222. The inner edge 221 faces the first ring structure 210, and the outer edge 222 faces away from the first ring structure 210. In some other embodiments, the outer edge 222 is aligned with the sidewall of the substrate 100. The second ring structure 220 also includes a top surface 220T and a bottom surface 220B. The bonding layer 260 is used to bond the bottom surface 220B of the second ring structure 220 to the substrate 100. In some embodiments, a material of the second ring structure 220 is stainless steel, glass, ceramics, copper, copper alloy, or other suitable materials.

In the illustrated embodiment, the top view (such as on the normal axis N of the substrate 100) of the outer edge 222 of the second ring structure 220 is a rectangle, and the inner edge 221 is a rounded rectangle. The inner edge 221 of the second ring structure 220 encircles the first ring structure 210. Specifically, a second space S2 is between the inner edge 221 of the second ring structure 220 and the outer edge 212 of the first ring structure 210. The top view of the second space S2 is, for example, a rounded rectangular ring, but the embodiment is not limited thereto. The first ring structure 210 is encircled by the second space S2. The first ring structure 210 is separated from the second ring structure 220 by the second space S2.

In some other embodiments, the first ring structure 210 and the second ring structure 220 are respectively bonded to the substrate 100 by the bonding layers 260. The sidewalls of the bonding layers 260 are aligned with the inner edge 211 and the outer edge 212 of the first ring structure 210. The sidewalls of the bonding layers 260 are aligned with the inner edge 221 and the outer edge 212 of the second ring structure 220. However, the embodiments are not limited to the shown FIG. 5B. In other embodiments, at least one of the bonding layers 260 is further extended along the sidewall of the first ring structure 210 (such as the inner edge 211 or the outer edge 212). In some other embodiments, at least one of the bonding layers 260 is extended along the sidewall of the second ring structure 220 (such as the inner edge 221 or the outer edge 222).

In the illustrated embodiment, the material of the first ring 210 is different from the material of the second ring 220. For example, the rigidity of the first ring structure 210 is greater than the rigidity of the second ring structure 220. That is to say, when acted on by the same force, the first ring structure 210 is less prone to be displaced than the second ring structure 220. Accordingly, in some other embodiments, the material of the first ring structure 210 is stainless steel, and the second ring structure 220 is copper. Based on the above configurations, the more rigid first ring structure 210 is disposed closer to the semiconductor device 120, so as to provide additional support to the semiconductor package 20A. The less rigid (or more flexible) second ring structure 220 is disposed outside of the first ring structure 210, so as to provide additional flexibility to the semiconductor package 20A. Therefore, the first ring structure 210 and the second ring structure 220 may prevent the cracking of the underfill 130 induced by the stress caused by the thermal expansion mismatch. The reliability of the semiconductor package 20A is improved, and the warpage is reduced. Furthermore, the risk of damaging the semiconductor device 120 is reduced, and the quality of the semiconductor package 20A is improved.

In some other embodiments, a coefficient of thermal expansion (CTE) of the first ring structure 210 is less than a coefficient of thermal expansion of the second ring structure 220. That is to say, when acted on by the same high temperature, the first ring structure 210 is less prone to deform than the second ring structure 220, thus the first ring structure 210 may provide additional support to the semiconductor package 20A. The less rigid second ring structure 220 may provide additional flexibility to the semiconductor package 20A. Therefore, the reliability of the semiconductor package 20A is improved, and the warpage is reduced.

In yet another embodiment, a thickness H1 of the first ring structure 210 is less than a thickness H2 of the second ring structure 220. The thickness H1 is defined as the shortest distance between the top surface 210T and the bottom surface 210B on the normal axis N to the substrate 100. The thickness H2 is defined as the shortest distance between the top surface 220T and the bottom surface 220B on the normal axis N to the substrate 100. The thickness H1 is less than the second thickness H2, therefor the first ring structure 210 is shorter than the second ring structure 220. The shorter first ring structure 210 is disposed closer to the semiconductor device 120 on the substrate 100 than the longer second ring structure 220. According to the above configurations, the support and the rigidity of the semiconductor package 20B is improved, and the warpage is reduced. Furthermore, the risk of damaging the semiconductor device 120 is reduced, and the quality of the semiconductor package 20B is improved.

In some other embodiments, the bonding layer 260 also has a thickness. The thickness of the bonding layer 260 is less than thickness of the first ring structure 210 and the second ring structure 220. The total thickness of the first ring structure 210 and the bonding layer 260 is less than the total thickness of the second ring structure 220 and the bonding layer 260. In yet another embodiment, the total thickness of the first ring structure 210 and the bonding layer 260 is substantially the same as the total thickness of the second ring structure 220 and the bonding layer 260, but not limited thereto.

In some other embodiments, the material of the first ring structure 210 and the material of the second ring structure 220 is the same material, so that the reliability of the semiconductor package 20A may be improved, and the warpage may be reduced.

In FIG. 5A and FIG. 5B, two ring structures are shown, however the number of the ring structures shown in FIG. 5A and FIG. 5B are not used to limit the number of the ring structures of the semiconductor package 20A. In some other embodiments, the number of the ring structures is three, four, five or more, depending on the design. The ring structure closet to the semiconductor device 120 has a higher rigidity than the ring structure further away from the semiconductor device. In yet another embodiment, the number of the ring structure is one.

Figure 6:
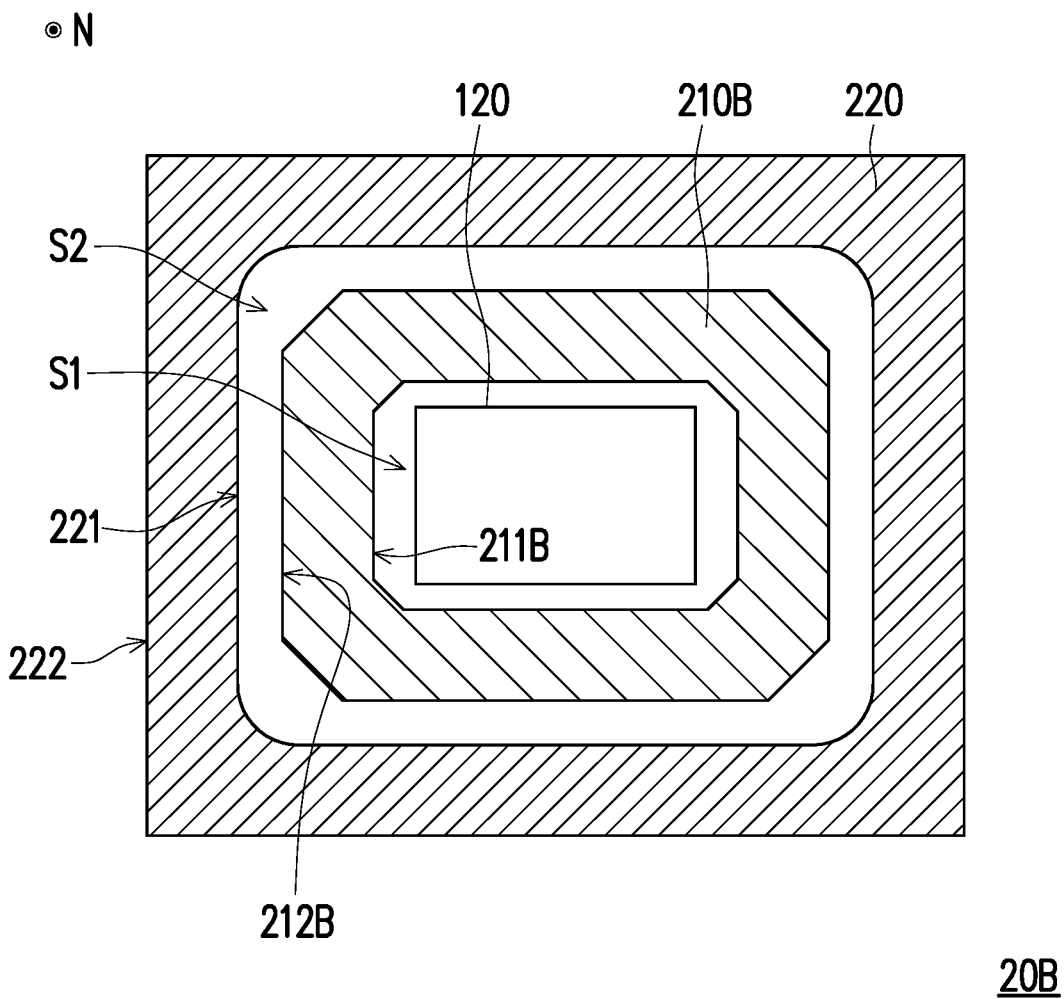
FIG. 6 to FIG. 9 illustrate various top views of semiconductor packages according to some other embodiments of the present application.

FIG. 6 to FIG. 9 illustrate various top views of semiconductor packages according to some other various embodiments of the present application. In some embodiments, the semiconductor package 20B of FIG. 6 is similar to the semiconductor package 20A illustrated in FIG. 5A and FIG. 5B, except that the top view of the first ring structure 210B is an octagonal ring structure. Specifically, the inner edge 211B of the first ring structure 210B is of an octagonal shape, so as to encircle an octagonal first space S1. The outer edge 212B of the first ring structure 210B is of an octagonal shape.

Figure 7:
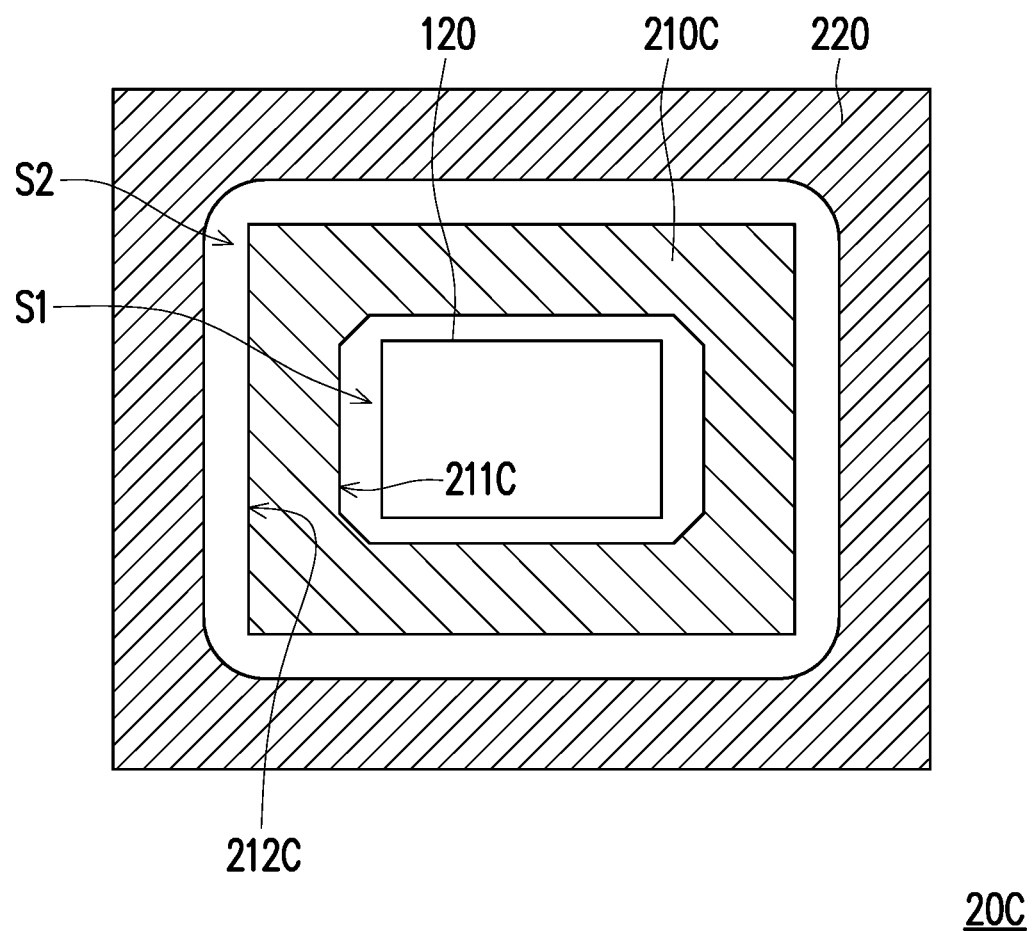

Referring to FIG. 7, the semiconductor package 20C of FIG. 7 is similar to the semiconductor package 20A illustrated in FIG. 5A and FIG. 5B, except that the top view of the first ring structure 210C is a rectangular ring structure. Specifically, the inner edge 211C of the first ring structure 210C is of an octagonal shape, so as to encircle an octagonal first space S1. The outer edge 212C of the first ring structure 210C is of a rectangular shape. That is to say, the top view of the first ring structure 210C is a rectangular ring structure with an octagonal inner edge.

Figure 8:
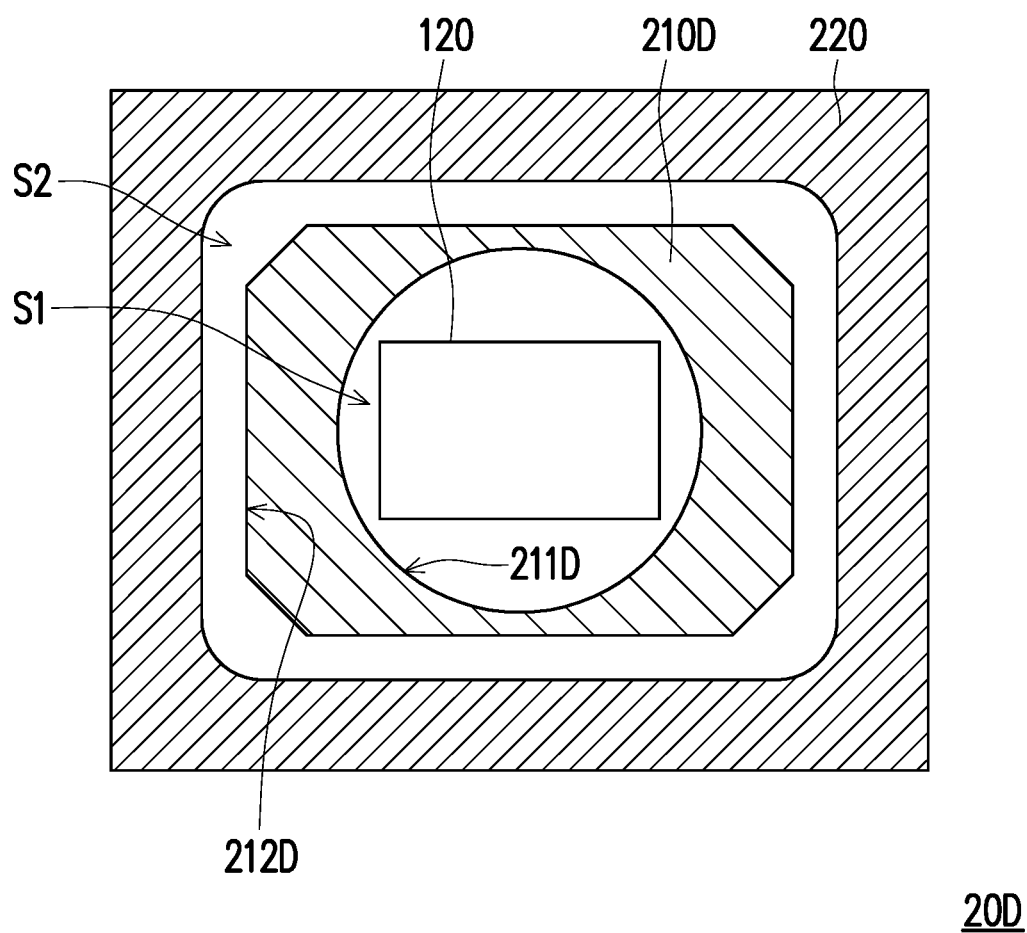

Referring to FIG. 8, the semiconductor package 20D of FIG. 8 is similar to the semiconductor package 20A illustrated in FIG. 5A and FIG. 5B, except that the top view of the first ring structure 210D is an octagonal ring structure.

Specifically, the inner edge 211D of the first ring structure 210D is of a circular shape, so as to encircle a circular first space S1. The outer edge 212D of the first ring structure 210D is of an octagonal shape. That is to say, the top view of the first ring structure 210D is an octagonal ring structure with a circular inner edge.

Figure 9:
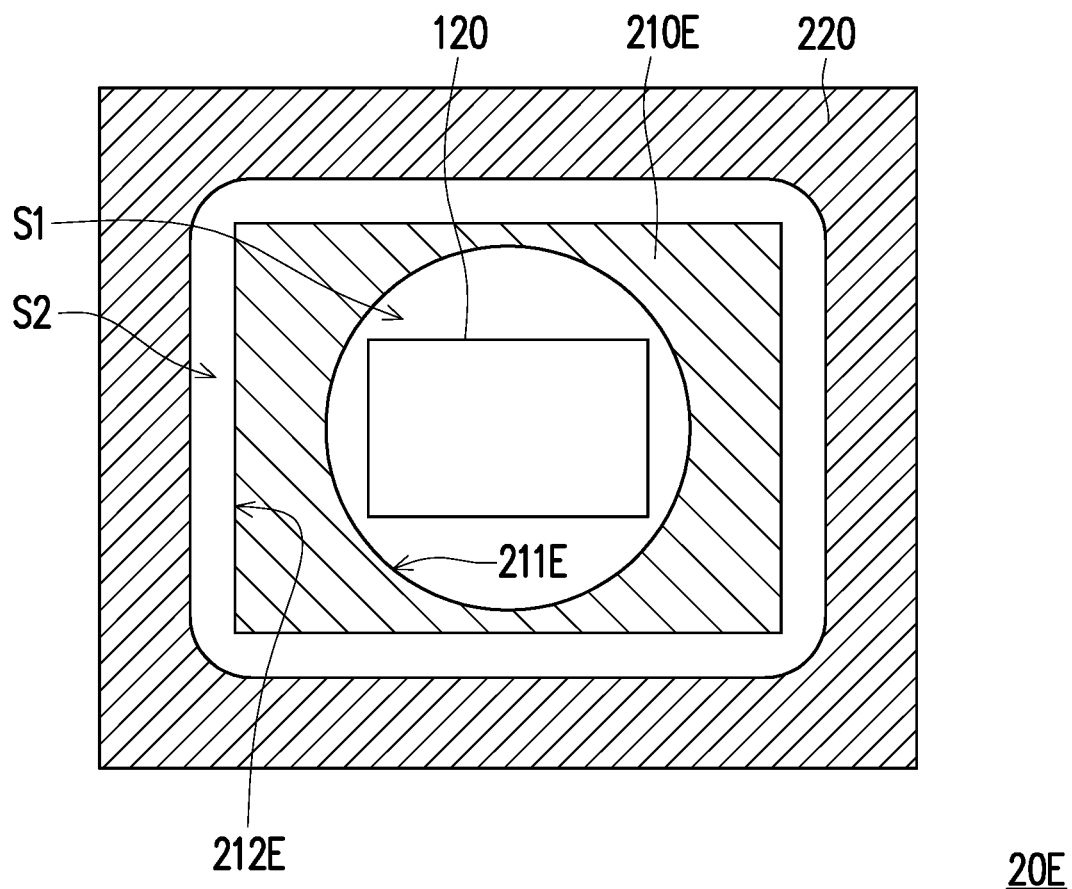

Referring to FIG. 9, the semiconductor package 20E of FIG. 8 is similar to the semiconductor package 20A illustrated in FIG. 5A and FIG. 5B, except that the top view of the first ring structure 210E is a rectangular ring structure. Specifically, the inner edge 211E of the first ring structure 210E is of a circular shape, so as to encircle a circular first space S1. The outer edge 212E of the first ring structure 210E is of a rectangular shape. That is to say, the top view of the first ring structure 210E is an rectangular ring structure with a circular inner edge.

It should be noted that, the outer edge and the inner edge of the first ring structure may be of any suitable geometric shape, including a triangular shape, a square shape, a rectangular shape, a polygonal shape, a circular shape, or an elliptical shape. In addition, the outer edge and the inner edge of the second ring structure is of any suitable geometric shape, including a triangular shape, a square shape, a rectangular shape, a polygonal shape, a circular shape, or an elliptical shape. The embodiment is not limited to those shown in FIG. 5A to FIG. 9.

Figure 10:
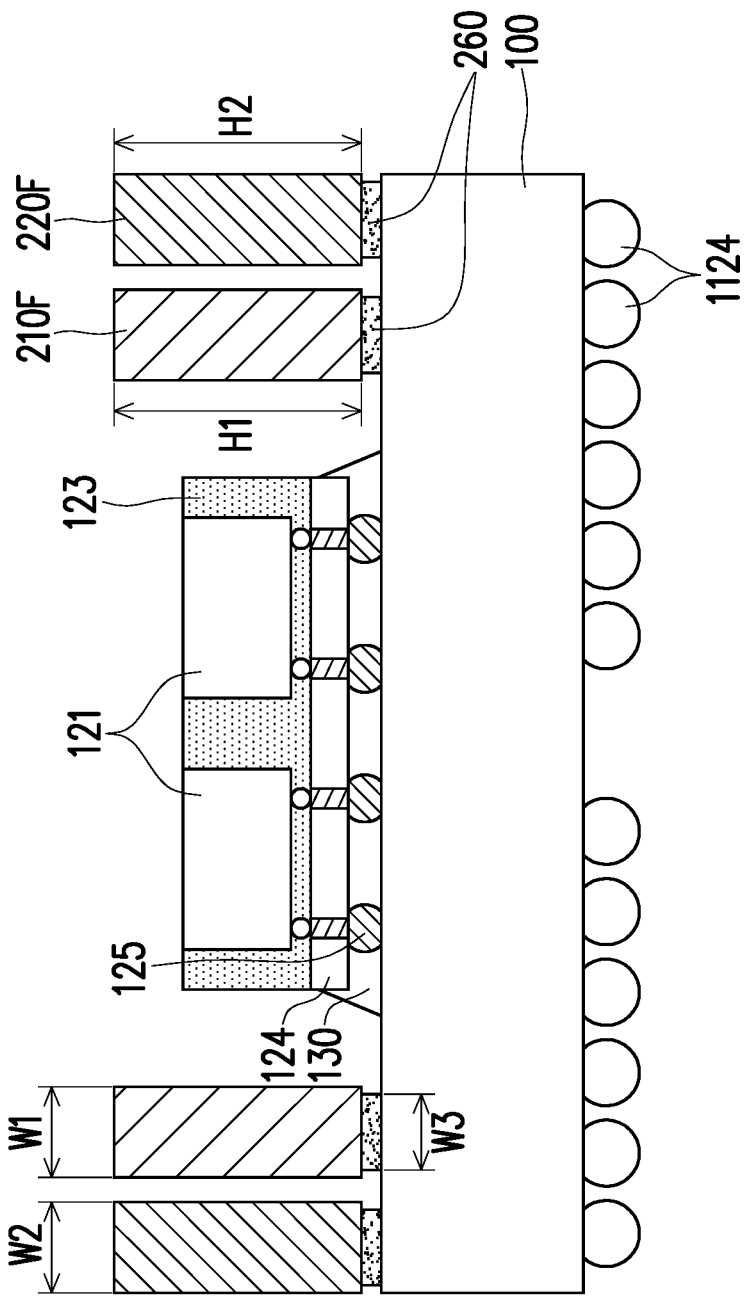
FIG. 10 to FIG. 11 illustrate various schematic cross-sectional views of semiconductor packages according to some other embodiments of the present application.
Figure 11:
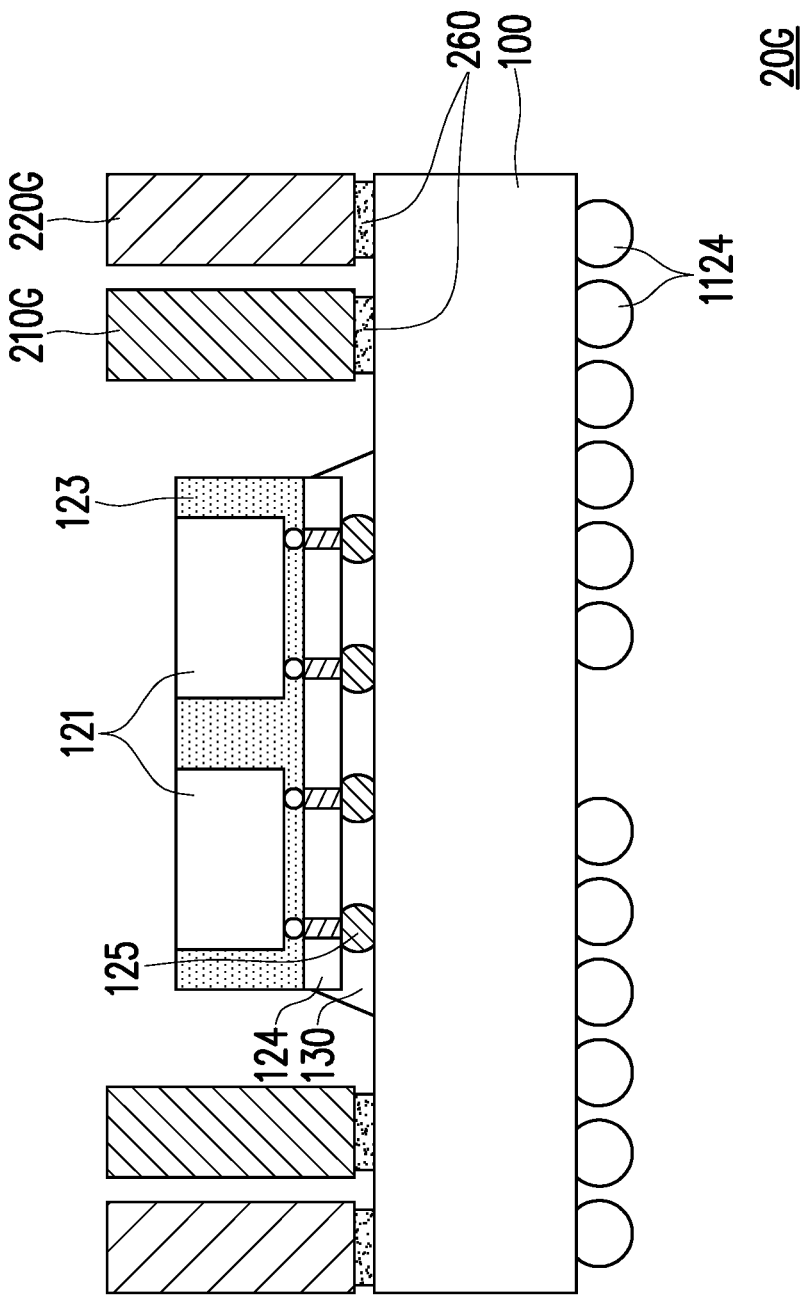

FIG. 10 to FIG. 11 illustrate various schematic cross-sectional views of semiconductor packages according to some other embodiments of the present application. In some embodiments, the semiconductor package 20F of FIG. 10 is similar to the semiconductor package 20A illustrated in FIG. 5A and FIG. 5B, except that the first ring structure 210F and the second ring structure 220F are of substantially the same thickness. Specifically, the height H1 of the first ring structure 210F is substantially the same as the height H2 of the second ring structure 210F.

In the illustrated embodiment of FIG. 10, the semiconductor device 120 is disposed on the substrate 100. The semiconductor device 120 includes the semiconductor dies 121, the encapsulant 123, the interposer 124, and the conductive terminals 125. In some embodiments, at least two semiconductor dies 121 are adjacently disposed over the interposer 124. The encapsulant 123 is disposed over the interposer 124 and encapsulates the semiconductor dies 121. In some embodiments, the top surface of the encapsulant 123 may be substantially coplanar with the top surface of the semiconductor dies 121. The conductive terminals 125 are disposed on the interposer 124 and connected to the through vias of the interposer 124. The conductive terminals 125 are used to connect the semiconductor device 120 to the substrate 100. The underfill 130 is dispensed in a gap between the interposer 124 and the top surface of the substrate 100. As illustrated in FIG. 10, a portion the underfill 130 also contacts the side surface of the interposer 124, but not limited thereto. Under the above configurations, the underfill 130 may absorb stress and protect the conductive terminals 125.

The first ring structure 210F is disposed on the top surface of the substrate 100. The second ring structure 220F is disposed on the top surface of the substrate 100. The semiconductor device 120 is encircled by the first ring structure 210F. The first ring structure 210F is encircled by the second ring structure 220F. In some embodiments, the thickness H1 of the first ring structure 210F is substantially the same as the thickness H2 of the second ring structure 220F, but not limited thereto. In some embodiments, the thickness H1 and the thickness H2 are respectively 1 millimeter (mm), but not limited thereto.

In some embodiments, the bonding layer 260 is used to bond the first ring structure 210F or the second ring structure 220F to the substrate. For example, the boning layer 260 is disposed between the first ring structure 210F and the substrate 100. The boning layer 260 is disposed between the second ring structure 220F and the substrate 100. In some other embodiments, a side surface of the bonding layer 260 is not aligned with the side surface of the first ring structure 210F. The side surface of the bonding layer 260 is not aligned with the side surface of the second ring structure 220F. That is to say, a lateral gap is between the side surface of the boning layer 260 and the side surface of the first ring structure 210F. Another lateral gap is between the side surface of the boning layer 260 and the side surface of the second ring structure 220F, but not limited thereto.

In some embodiments, the material of the first ring structure 210F and the materials of the second ring structure 220F are the same or different. For example, the materials of the first ring structure 210F and the second ring structure 220F are stainless steel, glass, ceramics, copper alloy, or other suitable materials. More specific, the material of the first ring structure 210F is stainless steel, and the material of the second ring structure 220F is copper, but not limited thereto.

Based on the above configurations, the more rigid first ring structure 210F is disposed closer to the semiconductor device 120, so as to provide additional support to the semiconductor package 20F. The less rigid (or more flexible) second ring structure 220F is disposed outside of the first ring structure 210F, so as to provide additional flexibility to the semiconductor package 20F. Therefore, the first ring structure 210F and the second ring structure 220F may prevent the cracking of the underfill 130 induced by the stress caused by the thermal expansion mismatch. The reliability of the semiconductor package 20F is improved, and the warpage is reduced. Furthermore, the risk of damaging the semiconductor device 120 is reduced, and the quality of the semiconductor package 20F is improved.

In some other embodiments, the material of the first ring structure 210F is stainless steel, and the material of the second ring structure 220F is stainless steel. Or, in another embodiment, the material of the first ring structure 210F is copper, and the material of the second ring structure 220F is copper. The reliability of the semiconductor package 20F is improved, and the warpage is reduced.

Referring to FIG. 11, the semiconductor package 20G of FIG. 11 is similar to the semiconductor package 20F illustrated in FIG. 10, except that the material of the first ring structure 210G is copper and the material of the second ring structure 220G is stainless steel. Based on the above configurations, the reliability of the semiconductor package 20G is improved, and the warpage is reduced.

Figure 12:
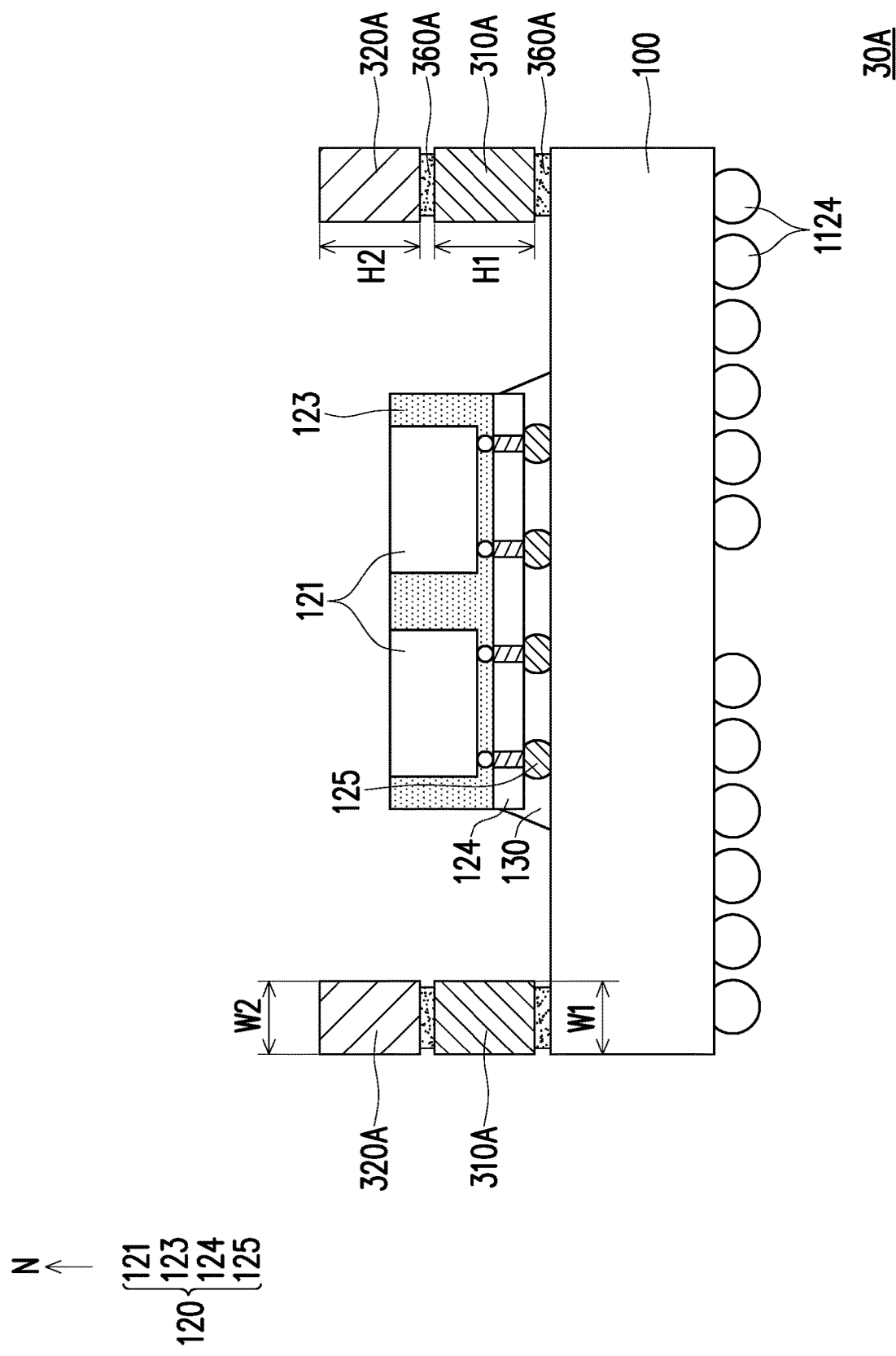
FIG. 12 to FIG. 15 illustrate various schematic cross-sectional views of semiconductor packages according to some other embodiments of the present application.

FIG. 12 to FIG. 15 illustrate various schematic cross-sectional views of semiconductor packages according to some other embodiments of the present application. In some embodiments, the semiconductor package 30A of FIG. 12 is similar to the semiconductor package 20A illustrated in FIG. 5A and FIG. 5B, except that the second ring structure 320A is stacked on the first ring structure 310A. Specifically, the first ring structure 310A is disposed on the substrate 100. The second ring structure 320A is disposed on the first ring structure 310A. The semiconductor device 120 is encircled by the first ring structure 310A and the second ring structure 320A.

Referring to FIG. 12, the first ring structure 310A is disposed on the top surface of the substrate 100. The bonding layer 360A is disposed between the first ring structure 310A and the top surface of the substrate 100.

The second ring structure 320A is disposed on the first ring structure 310A. An optional bonding layer 360B is disposed between the first ring structure 310A and the second ring structure 320A. In some other embodiments, the second ring structure 320A directly contacts the first ring structure 320A, but not limited thereto. The first ring structure 310A and the second ring structure 320A may be aligned vertically and encircle the semiconductor device 120. Specifically, the width W1 of the first ring structure 310A is substantially the same as the width W2 of the second ring structure 320A, but not limited thereto.

In some embodiments, the thickness H1 of the first ring structure 310A is 1 mm, but not limited thereto. The thickness H2 of the second ring structure 320A is 1 mm, but not limited thereto. That is to say, the thickness H1 of the first ring structure 310A and the thickness H2 of the second ring structure 320A may be substantially similar, but not limited thereto.

The material of the first ring structure 310A is different from the material of the second ring structure 320A. In accordance to an embodiment, the material of the first ring structure 310A is stainless steel, but not limited thereto. The material of the second ring structure 320A is copper but not limited thereto. In some other embodiments, the material of the first ring structure 310A is the same as the material of the second ring structure 320A. For example. the material of the first ring structure 310A and the material of the second ring structure 320A are stainless steel. In another example, the material of the first ring structure 310A and the material of the second ring structure 320A are copper, but not limited thereto. Based on the above configurations, the more rigid first ring structure 310A provides additional support to the semiconductor package 30A. The less rigid (or more flexible) second ring structure 320B provides additional flexibility to the semiconductor package 30A. Therefore, the first ring structure 310A and the second ring structure 320A may prevent the cracking of the underfill 130 induced by the stress caused by the thermal expansion mismatch. The reliability of the semiconductor package 30A is improved, and the warpage is reduced. Furthermore, the risk of damaging the semiconductor device 120 is reduced, and the quality of the semiconductor package 30A is improved.

Figure 13:
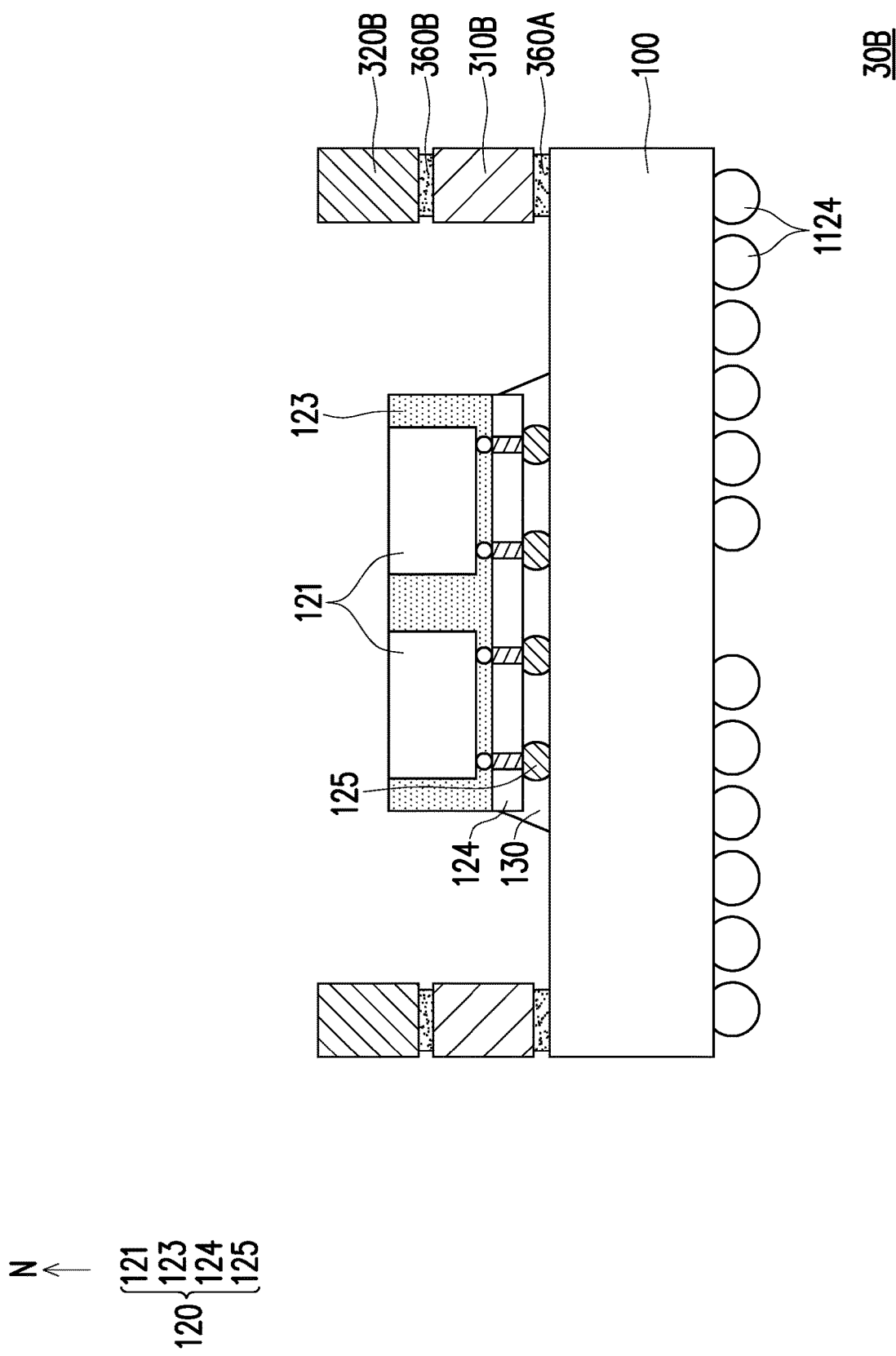

Referring to FIG. 13, the semiconductor package 30B of FIG. 13 is similar to the semiconductor package 30A illustrated in FIG. 12, except that the material of the first ring structure 310B is copper and the material of the second ring structure 320B is stainless steel. Based on the above configurations, the reliability of the semiconductor package 30B is improved, and the warpage is reduced.

Figure 14:
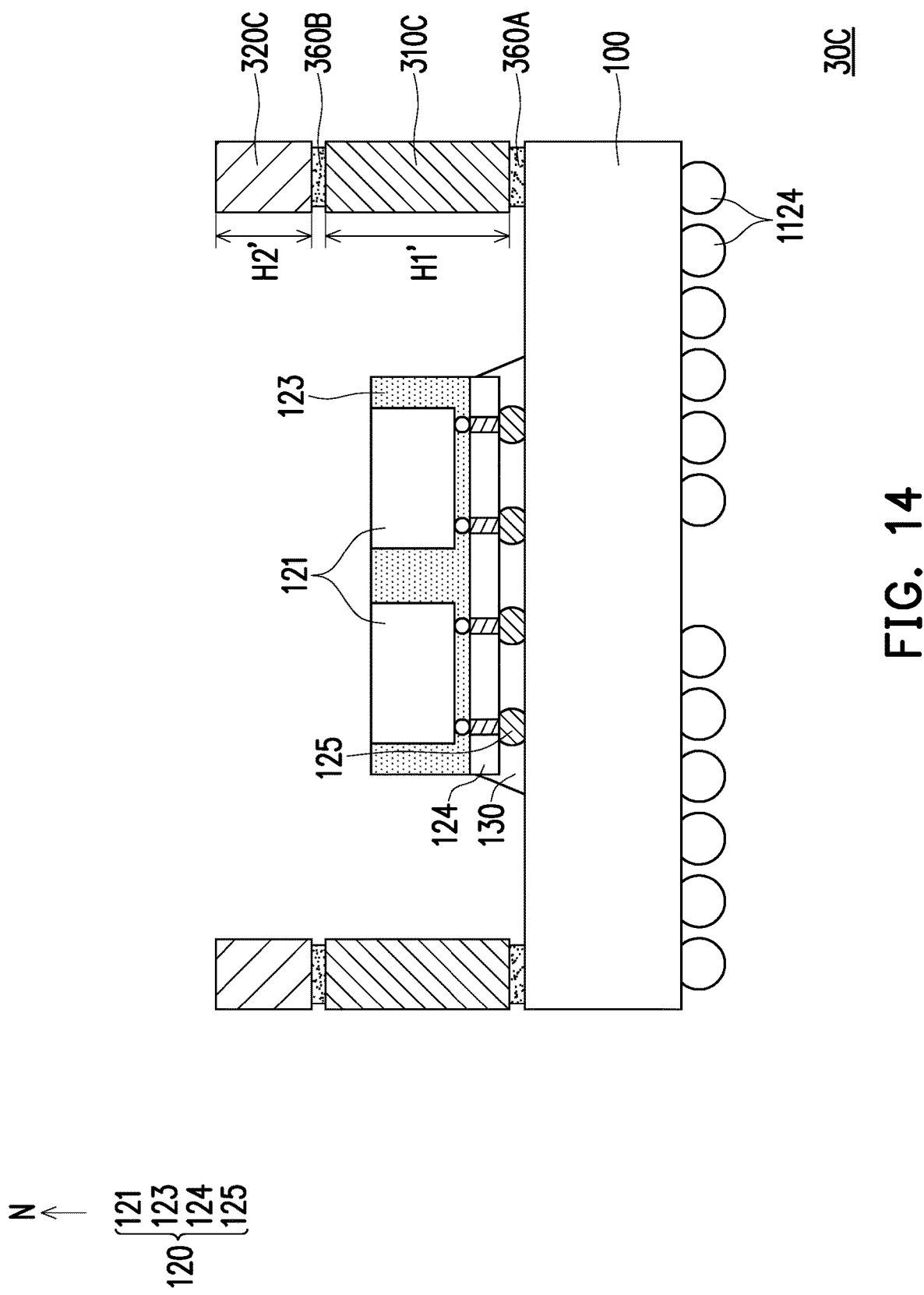

Referring to FIG. 14, the semiconductor package 30C of FIG. 14 is similar to the semiconductor package 30A illustrated in FIG. 12, except that the thickness H1' of the first ring structure 310C is larger than the thickness H2' of the second ring structure 320C. In some embodiments, the thickness H1' of the first ring structure 310C is 1.5 mm, and the thickness H2' of the second ring structure 320C is 0.5 mm, but not limited thereto. The material of the first ring structure 310C is stainless steel, and the material of the second ring structure 320C is copper, but not limited thereto. Based on the above configurations, the reliability of the semiconductor package 30C is improved, and the warpage is reduced.

Figure 15:
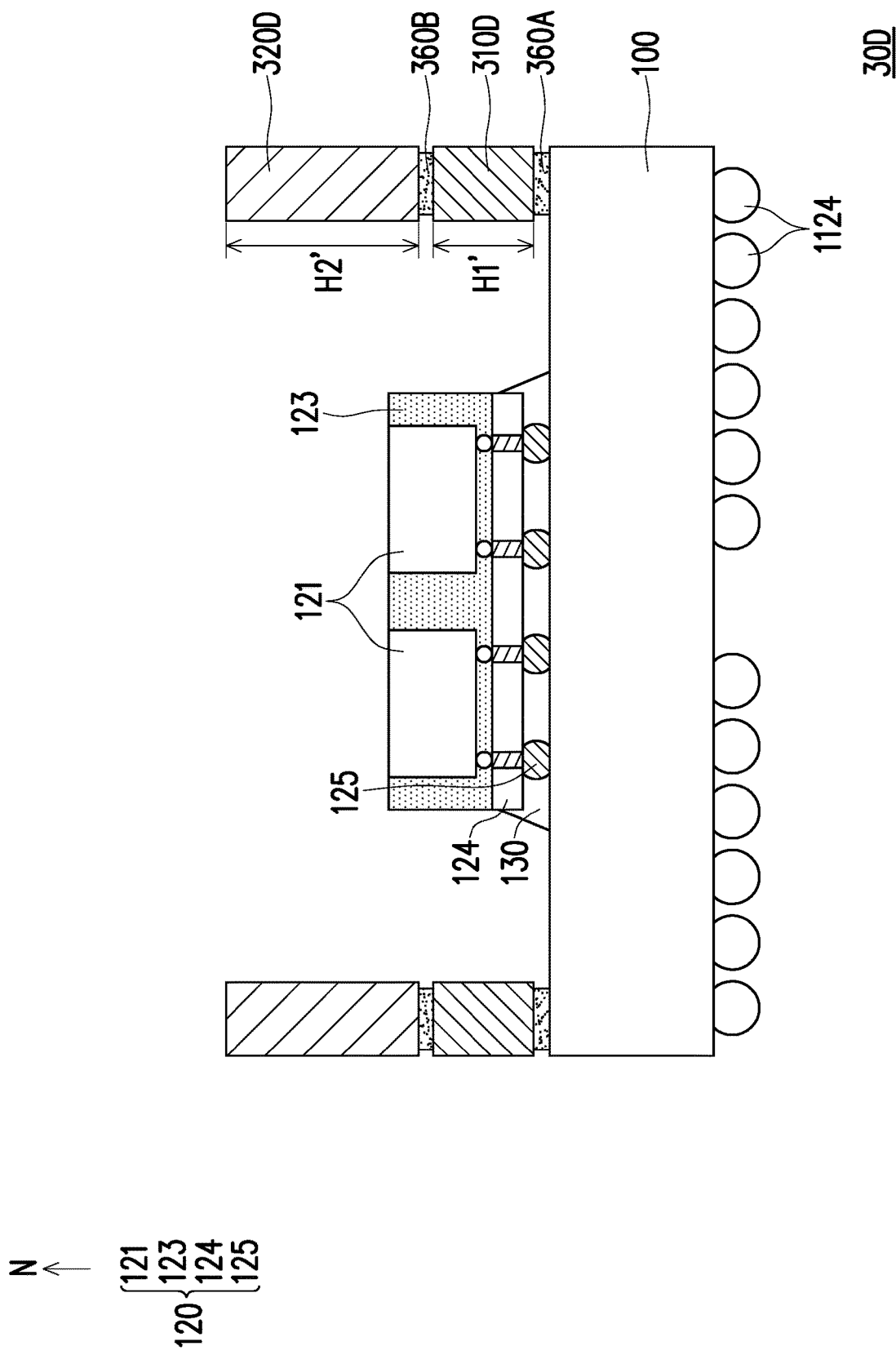

Referring to FIG. 15, the semiconductor package 30D of FIG. 15 is similar to the semiconductor package 30A illustrated in FIG. 12, except that the thickness H1' of the first ring structure 310D is less than the thickness H2' of the second ring structure 320D. In some embodiments, the thickness H1' of the first ring structure 310D is 0.5 mm, and the thickness H2' of the second ring structure 320D is 1.5 mm, but not limited thereto. The material of the first ring structure 310D is stainless steel, and the material of the second ring structure 320D is copper, but not limited thereto. In some other embodiments, the material of the first ring structure 310D is copper, and the material of the second ring structure 320D is stainless steel. In yet another embodiment, the material of the first ring structure 310D and the material of the second ring structure 320D is the same, but not limited thereto. Based on the above configurations, the reliability of the semiconductor package 30D is improved, and the warpage is reduced.

In the above-mentioned embodiments, since the semiconductor package may include the ring structure or ring structures, the ring structures is able to provide additional support and rigidity to the semiconductor package. For example, the ring structure is composed of a rigid material, or the first ring structure having a greater rigidness than the second ring structure, According to the above configurations, the ring structure surrounding the semiconductor device is able to reduce and absorb stress caused by the thermal expansion mismatch during the high temperature of the manufacturing process. Thus, the ring structure is able to reduce the warpage of the substrate and the semiconductor device. The cracking of the underfill during high temperature or room temperature is reduced, thus the risk of damaging the semiconductor device is also reduced, so as to improve the reliability of the semiconductor package.

In accordance with some embodiments of the application, a semiconductor package includes a substrate, a semiconductor device, and a ring structure. The semiconductor device disposed on the substrate. The ring structure disposed on the substrate and surrounds the semiconductor device. The ring structure includes a first portion and a second portion. The first portion bonded to the substrate. The second portion connects to the first portion. A cavity is between the second portion and the substrate.

In accordance with alternative embodiments of the application, a semiconductor package includes a substrate, a semiconductor device, a first ring structure, and a second ring structure. The semiconductor device disposed on the substrate. The first ring structure disposed on the substrate and surrounds the semiconductor device. The second ring structure disposed on the substrate and surrounds the first ring structure. A material of the first ring structure is different from a material of the second ring structure.

In accordance with yet alternative embodiments of the application, a semiconductor package includes a substrate, a semiconductor device, a first ring structure, and a second ring structure. The semiconductor device disposed on the substrate. The first ring structure disposed on the substrate and surrounds the semiconductor device. The second ring structure disposed on the substrate. The semiconductor device is encircled by the first ring structure and the second ring structure.

The foregoing outlines features of several embodiments so that those skilled in the art may better understand the aspects of the present application. Those skilled in the art should appreciate that they may readily use the present application as a basis for designing or modifying other processes and structures for carrying out the same purposes and/or achieving the same advantages of the embodiments introduced herein. Those skilled in the art should also realize that such equivalent constructions do not depart from the spirit and scope of the present application, and that they may make various changes, substitutions, and alterations herein without departing from the spirit and scope of the present application.

What is claimed is:

1. A semiconductor package, comprising:
a substrate;
a semiconductor device disposed on the substrate; and
a ring structure disposed on the substrate and surrounds the semiconductor device, the ring structure comprising:
a first portion bonded to the substrate; and
a second portion connecting to the first portion, wherein a cavity is between the second portion and the substrate, and the cavity is spaced apart from a space encircled by the first portion.

2. The semiconductor package of claim 1, wherein the first portion and the second portion are the same material.

3. The semiconductor package of claim 1, further comprising a bonding layer, the bonding layer bonded the first portion of the ring structure to the substrate.

4. The semiconductor package of claim 3, wherein the bonding layer partially fills the cavity.

5. The semiconductor package of claim 3, wherein the bonding layer fills the cavity, and the bonding layer contacts the second portion.

6. The semiconductor package of claim 1, wherein a first thickness of the first portion is greater than a second thickness of the second portion.

7. The semiconductor package of claim 1, wherein a top surface of the first portion is substantially coplanar with a top surface of the second portion.

8. The semiconductor package of claim 1, wherein the second portion extends outwardly from a top of the first portion.

9. A semiconductor package, comprising:
a substrate;
a semiconductor device disposed on the substrate;
a first ring structure disposed on the substrate and surrounds the semiconductor device;
a second ring structure disposed on the substrate and surrounds the first ring structure; and
a plurality of bonding layers, the bonding layers respectively bonding the first ring structure and the second ring structure to the substrate.

10. The semiconductor package of claim 9, wherein a rigidity of the first ring structure is greater than a rigidity of the second ring structure.

11. The semiconductor package of claim 9, wherein a coefficient of thermal expansion of the first ring structure is less than a coefficient of theiinal expansion of the second ring structure.

12. The semiconductor package of claim 9, wherein a material of the first ring structure is stainless steel, and a material of the second ring structure is copper.

13. The semiconductor package of claim 9, wherein a material of the first ring structure is different from a material of the second ring structure.

14. The semiconductor package of claim 13, wherein at least one of the bonding layers further extends along a sidewall of the first ring structure, or further extends along a sidewall of the second ring structure.

15. The semiconductor package of claim 9, wherein the first ring structure encircles a first space, and the semiconductor device is placed in the first space.

16. The semiconductor package of claim 15, wherein on a normal axis of the substrate, a top view of the first space is selected from a square shape, a polygonal shape, a circular shape, and an elliptical shape.

17. The semiconductor package of claim 9, wherein a second space is between the second ring structure and the first ring structure, and the first ring structure is encircled by the second space.

18. A semiconductor package, comprising:
a substrate;
a semiconductor device disposed on the substrate;
a first ring structure disposed on the substrate and surrounds the semiconductor device;
a second ring structure disposed on the substrate and surrounds the first ring structure, wherein the second ring structure is higher than the first ring structure; and
a plurality of bonding layers, wherein the first ring structure and the second ring structure are respectively bonded to the substrate through the bonding layers, wherein a first rigidity of the first ring structure is greater than a second rigidity of the second ring structure.

19. The semiconductor package of claim 18, wherein the second ring structure is spaced apart from the first ring structure.

20. The semiconductor package of claim 18, wherein a material of the first ring structure is different from a material of the second ring structure.

* * * * *